Figure 1:
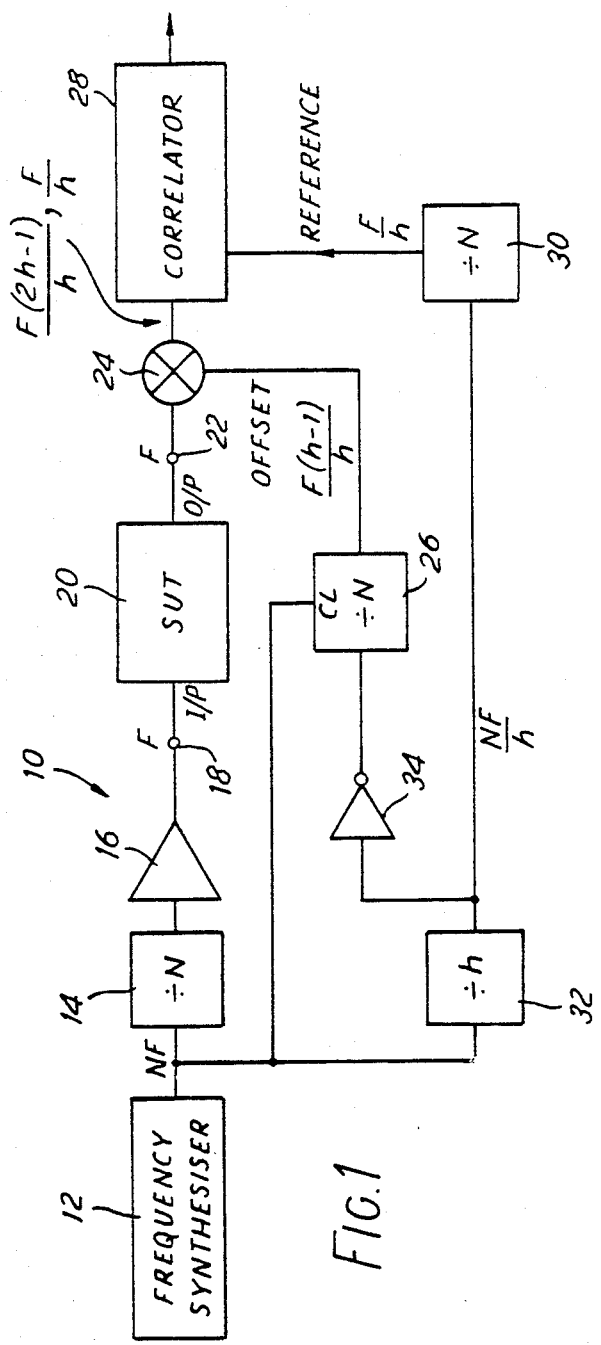

United States Patent [19]
Ryder

[11] Patent Number: 4,510,440
[45] Date of Patent: Apr. 9, 1985

[54] METHODS AND APPARATUS FOR FREQUENCY RESPONSE ANALYSIS

[75] Inventor: Alan Ryder, Church Crookham, England

[73] Assignee: Schlumberger Electronics (U.K.) Limited, Farnborough, England

[21] Appl. No.: 445,791

[22] Filed: Dec. 1, 1982

[30] Foreign Application Priority Data

Dec. 3, 1981 [GB] United Kingdom ............... 8136536

[51] Int. Cl.$^3$ ............................................. G01R 23/16
[52] U.S. Cl. .................................. 324/77 G; 324/77 B; 324/77 R
[58] Field of Search ................ 324/77 R, 77 G, 77 B, 324/57 R, 58.5, 57 N, 78 R, 78 E, 78 F, 79 R, 71.5, 121 R; 364/485, 489

[56] References Cited

U.S. PATENT DOCUMENTS

| | | | |
|---|---|---|---|
| 3,808,526 | 4/1974 | Jackson | 324/57 R |
| 3,988,667 | 10/1976 | Roth | 324/77 B |
| 4,023,098 | 5/1977 | Roth | 324/77 R |
| 4,104,725 | 8/1978 | Rose | 324/121 R |

*Primary Examiner*—Michael J. Tokar
*Attorney, Agent, or Firm*—Dale Gaudier

[57] ABSTRACT

In a heterodyning arrangement to enable frequency response testing of a system at a high frequency F using a digital correlator capable of operation at a lower frequency F/h, an offset signal is generated at a frequency $F(h-1)/h$ and multiplied with the output signal of the system under test. Two heterodynes result: a wanted signal at a frequency F/h, and an unwanted image signal at $F(2h-1)/h$. The value of h is selectable independently of a divisor N which controls derivation of the test frequency F from a frequency synthesizer operating at a frequency NF. Thus the frequency of the image signal can be arranged to avoid spurious non-zero responses in the digital correlation process at frequencies related to N.

6 Claims, 1 Drawing Figure

METHODS AND APPARATUS FOR FREQUENCY RESPONSE ANALYSIS

This invention relates to methods and apparatus for frequency response analysis, and in particular for testing the response of a system to an input signal at a relatively high frequency using a correlator capable of operating at a relatively lower frequency.

Frequency response analysis, in which the input signal applied to a system is compared with the output signal from the system at various frequencies, is a well-known technique for chatacterising the behaviour of, for example, servo systems, rotating machinery, electric and electronic circuits and elastic and viscous materials. The output signal is often analysed by correlating it with reference signals which are in phase and in quadrature phase with the input signal to the system.

In order to permit testing of systems at frequencies above the range of operation of standard correlators, it is also known to mix (or multiply) the output signal from the system under test with an offset signal whose frequency is spaced from the frequency of the input signal applied to the system by an amount equal to the frequency of the desired signal for application to the correlator. The mixing process produces two beat or heterodyne signals, the required one at the difference of the output and offset signal frequencies and an unwanted one (the image signal) at the sum of those frequencies.

In the past, the system input and offset signals have been generated using a frequency synthesiser and respective dividers set to division ratios of N and N+1 (or N−1). Thus, if the frequency synthesiser output is at a frequency of NF, the system input signal, and its fundamental output signal, will be at a frequency F. The offset signal will be at a frequency F N/(N+1). The heterodynes produced by the mixing process are thus the required one at F/(N+1) and the unwanted image one at F(2N+1)/(N+1).

The reference signals for the correlator are typically derived from the offset signal via another divide-by-N divider, to produce signals at F/(N+1), the same frequency as the lower of the two heterodyne signals. The correlation process is such that its response is at a maximum at the reference signal frequency, and, theoretically, zero at all harmonics of the reference signal frequency. However, the quantised nature of the (digital) correlation process results in reality in a non-zero spurious response at certain harmonic frequencies. It has been found that with the heterodyning arrangement described above, one of these non-zero response harmonic frequencies coincides with the unwanted heterodyne at F(2N+1)/(N+1). Furthermore, the response at this frequency is sufficiently large to cause a significant error in the test result unless provision is made for expensive and time-consuming calibration and adjustment of the circuitry.

According to one aspect of this invention there is provided a method for testing the response of a system to an input signal at a relatively high frequency F using a correlator capable of operating at a relatively lower frequency F/h, comprising the steps of:
generating a first signal at said high frequency F;
generating a second signal at a frequency F/h;
deriving a third signal at a frequency F(h−1)/h;
applying said first signal to the system under test;
multiplying the output signal from the system by the third signal;
and comparing the product signal in the correlator with the second signal.

According to another aspect of this invention there is provided apparatus for testing the response of a system to an input signal at a relatively high frequency F using a correlator capable of operating at a relatively lower frequency F/h, comprising:
means for generating a first signal at said high frequency F;
means for generating a second signal at a frequency F/h;
means for deriving a third signal at a frequency F(h−1)/h; and
means for multiplying the output signal from the system under test by the third signal while the first signal is applied thereto;
said correlator being arranged to compare the product signal with the second signal.

With this invention, it is possible to provide a heterodyne ratio h which is independent of any frequency division (by the factor N in the above discussion) required to yield the desired test frequency. Consequently, the values of h and N can be chosen to avoid coincidence of any unwanted image heterodyne with any non-zero spurious response of the correlation process.

A method and apparatus in accordance with this invention will now be described, by way of example, with reference to the accompanying drawings, in which:

FIG. 1 is a block schematic diagram of the apparatus.

The apparatus to be described forms part of a frequency response analyser (sometimes also known as a transfer function analyser), in which a signal of predetermined frequency and waveform (generally sinusoidal) is generated and applied as a stimulus to a system whose dynamic behaviour is to be characterised. The reaction (output signal) of the system to the stimulus is sensed by the analyser and measured, being expressed for example in terms of a sinusoidal signal synchronous with and having a stated amplitude and phase angle relative to the stimulus (input) signal.

The measurement of this amplitude and phase angle involves the use of a correlator which multiplies the output signal from the system under test by at least one reference signal which is synchronous with the stimulus or test signal. An example of the type of circuitry which can be used is described in U.S. Pat. No. 3,808,526.

Since correlation involves multiplication, which tends to be a time-consuming process, and the speed of the correlator determines the maximum signal frequency which the correlator can accept, the upper frequency limit of the correlation process is usually well below the maximum test frequency required in practice. It is known to overcome this limitation by heterodyning the output signal from the system under test with an offset signal at a frequency spaced from that of the output signal by an amount which is within the bandwidth of the correlator. Thus one of the resultant heterodynes (the difference signal) can be processed by the correlator. However, in known methods the heterodyning ratio is linked to the sampling rate of the (digital) correlator, with the result that the unwanted heterodyne (the sum signal) coincides with a spurious non-zero response in the correlation process, arising from the quantised nature of the process. FIG. 1 shows a heterodyning circuit which avoids this problem.

Referring to FIG. 1, the frequency response analyser 10 has a frequency synthesiser 12 which supplies a signal at a frequency NF, where F is the frequency of the test signal to be applied to the system under test. The output from the synthesiser 12 is applied via a divide-by-N divider 14 and a power amplifier 16 to an output terminal 18 of the analyser 10, this terminal being connected to the input of the system 20 under test.

The output of the system 20 is connected to an input 22 of the analyser 10, and thus to a multiplier 24 which also receives an offset signal from a divide-by-N divider 26. The output of the multiplier 24 is connected to one input of a correlator 28 which also receives a reference signal from a divide-by-N divider 30. The output of the correlator 28 is supplied to a display, plotter or recorder, etc., as required.

The output from the synthesiser 12 is also supplied to a divide-by-h divider 32 which thus provides a signal at a frequency NF/h. This signal is supplied directly to the divider 30, producing a signal at a frequency F/h as the reference signal for the correlator 28. In addition, the output signal from the divider 32 is supplied via an inverter 34 to the divider 26, which is clocked by the signal from the frequency synthesiser 12 at a frequency NF.

The design and operation of each individual item of circuitry shown in FIG. 1, and inparticular of the frequency synthesiser 12 and the correlator 28, can be conventional and do not form part of this invention, and thus need not be discussed here.

The operation of the divider 32 is to supply an output signal at a rate 1/h times that of the signal from the frequency synthesiser 12. Thus, in effect for every hth cycle of the signal supplied to the divider 32, one cycle is supplied by the divider 32, while for the other (h−1) cycles no output is provided by the divider 32. However, this output signal is inverted by the inverter 34, so that for every (h−1) clock pulses supplied to the divider 26 there is an input signal present from the inverter 34, whereas for the hth cycle only there is no input signal. Consequently, the divider 26 counts (h−1) out of every h of the clock pulses it receives at a frequency NF from the synthesiser 12, and divides the result by N, giving an output at a frequency (h−1)/h.NF/N, that is (h−1)F/h.

When this signal is mixed in the multiplier 24 with the output signal from the system under test at a frequency F, two heterodynes result: the desired one at a frequency F/h, which is correlated with the signal at a frequency of F/h from the divider 30; and an unwanted image heterodyne at F(2h−1)/h. However, since h is selectable independently of N (in contrast to known arrangements where a single quantity N controls both the heterodyne ratio and the division ratio for the test signal frequency), their values can be chosen to avoid any spurious response to the unwanted image heterodyne. Thus, for example, h may have a value of 50, and N may have a value of 52. With these figures, the spurious non-zero responses of the correlator 28 would be at F.103/50 and F.105/50. However, the heterodynes would be at F/50 (the wanted value) and F.99/50 (the unwanted value, which does not coincide with either spurious response of the correlator 28). As a result, complex adjustment of the correlator to zero out the spurious responses, which is expensive in components and time-consuming in performance, is rendered unnecessary.

The invention requires the generation of the function F(h−1)/h, rather than the more straightforward F.N/(N+1) which is used in the known techniques. However, this function can be generated, as shown in FIG. 1, by appropriate inversion of the output of a divide-by-h divider.

I claim:

1. A method for testing the response of a system to an input signal at a frequency F using a correlator capable of operating at a lower frequency F/h, where h is a number greater than 1, comprising the steps of:
   generating a first signal at said frequency F;
   generating a second signal at a frequency F/h;
   generating a third signal at a frequency F(h−1)/h;
   applying said first signal to the system under test;
   multiplying the output signal from the system by the third signal to produce a product signal;
   and comparing the product signal in the correlator with the second signal to analyze system response to said input signal.

2. A method according to claim 1, wherein said second signal is generated with a divide-by-h divider and said third signal is generated with an inverted carry signal from said divider.

3. A method according to claim 2, including the step of generating an initial signal at a frequency NF, where N is a number greater than 1 and different from h; and wherein said first signal is generated from said initial signal with a divide-by-N divider; said second signal is generated from said initial signal with said divide-by-h divider and a divide-by-N divider; and said third signal is generated from said inverted carry signal with a divide-by-N divider clocked at said frequency NF.

4. Apparatus for testing the response of a system to an input signal at a frequency F using a correlator capable of operating at a lower frequency F/h, where h is a number greater than 1, comprising:
   means for generating a first signal at said frequency F;
   means for generating a second signal at a frequency F/h;
   means for generating a third signal at a frequency F(h−1)/h; and
   means for multiplying the output signal from the system under test by the third signal while the first signal is applied thereto to produce a product signal;
   said correlator being arranged to compare the product signal with the second signal for analyzing system response to said input signal.

5. Apparatus according to claim 4, including a divide-by-h divider arranged to generate said second signal, and means for inverting a carry signal from said divider, said means for generating said third signal being responsive to said inverting means.

6. Apparatus according to claim 5, wherein: said means for generating said first signal comprises means arranged to generate an initial signal at a frequency NF, where N is a number greater than 1 and and different from h, and a divide-by-N divider; said means for generating said second signal comprises said divide-by-h divider coupled to receive said initial signal, and a divide-by-N divider; and said means for generating said third signal comprises a divide-by-N divider coupled to receive the inverted carry signal and clocked at the frequency NF.

* * * * *